US012256581B2

(12) United States Patent
Yang et al.

(10) Patent No.: US 12,256,581 B2
(45) Date of Patent: Mar. 18, 2025

(54) LIGHT-EMITTING SUBSTRATE, BACKLIGHT SOURCE AND DISPLAY DEVICE

(71) Applicants: Beijing BOE Optoelectronics Technology Co., Ltd., Beijing (CN); BOE Technology Group Co., Ltd., Beijing (CN)

(72) Inventors: Zhichao Yang, Beijing (CN); Jian Wang, Beijing (CN); Yong Zhang, Beijing (CN); Xianglei Qin, Beijing (CN); Jian Lin, Beijing (CN); Limin Zhang, Beijing (CN); Zepeng Sun, Beijing (CN); Liangzhen Tang, Beijing (CN); Zhilong Duan, Beijing (CN); Honggui Jin, Beijing (CN); Yashuai An, Beijing (CN); Lingfang Nie, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 549 days.

(21) Appl. No.: 17/627,311

(22) PCT Filed: Mar. 17, 2021

(86) PCT No.: PCT/CN2021/081324
§ 371 (c)(1),
(2) Date: Jan. 14, 2022

(87) PCT Pub. No.: WO2021/190378
PCT Pub. Date: Sep. 30, 2021

(65) Prior Publication Data
US 2022/0263000 A1    Aug. 18, 2022

(30) Foreign Application Priority Data

Mar. 24, 2020  (CN) .......................... 202020380907.6

(51) Int. Cl.
*H01L 33/62* (2010.01)
*G02F 1/13357* (2006.01)
(Continued)

(52) U.S. Cl.
CPC ..... *H10H 20/857* (2025.01); *G02F 1/133603* (2013.01); *H01L 25/0753* (2013.01)

(58) Field of Classification Search
CPC ..... H01L 25/167; H01L 23/5386; G09G 3/32; G09G 2300/0408
See application file for complete search history.

(56) References Cited

U.S. PATENT DOCUMENTS

2018/0033853 A1*  2/2018  Bower ................... H10K 59/35

FOREIGN PATENT DOCUMENTS

| CN | 107783222 A | 3/2018 |
| CN | 108287436 A | 7/2018 |

(Continued)

*Primary Examiner* — Elmito Breval
(74) *Attorney, Agent, or Firm* — Nath, Goldberg & Meyer; Joshua B. Goldberg

(57) ABSTRACT

The present disclosure provides a light-emitting substrate, a backlight source, and a display device. The light-emitting substrate includes: a base substrate having a first surface and a second surface which are opposite, and including a light-emitting area and a bonding area located on a side of the light-emitting area; a light-emitting unit disposed on the first surface of the base substrate and located in the light-emitting area, and including a plurality of light-emitting elements which are connected together; and transmission lines disposed on the base substrate; where at least a part of at least one transmission line is located on the second surface of the (Continued)

base substrate, and two ends of the light-emitting unit are respectively connected to the bonding area through different transmission lines.

20 Claims, 5 Drawing Sheets

(51) Int. Cl.
*H01L 25/075* (2006.01)
*H10H 20/857* (2025.01)

(56) References Cited

FOREIGN PATENT DOCUMENTS

| | | |
|---|---|---|
| CN | 109031779 A | 12/2018 |
| CN | 110770643 A | 2/2020 |
| CN | 211375271 U | 8/2020 |
| JP | 2010238497 A | 10/2010 |
| TW | 200801726 A | 1/2008 |

* cited by examiner

LIGHT-EMITTING SUBSTRATE, BACKLIGHT SOURCE AND DISPLAY DEVICE

CROSS-REFERENCE TO RELATED APPLICATION

This is a National Phase Application filed under 35 U.S.C. 371 as a national stage of PCT/CN2021/081324, filed Mar. 17, 2021, an application claiming the benefit of Chinese Patent Application No. 202020380907.6, filed Mar. 24, 2020, the content of each of which is hereby incorporated by reference in its entirety.

TECHNICAL FIELD

The present disclosure relates to the field of display technology, and in particular, to a light-emitting substrate, a backlight source and a display device.

BACKGROUND

A Mini-LED (Mini light-emitting diode) light-emitting module may be used as a backlight module in a liquid crystal display device to improve display contrast. In the Mini-LED light-emitting module, Mini-LEDs may be controlled according to division areas. However, in the Mini-LED light-emitting module, a problem that the Mini-LEDs which should be turned off still are turned on in the division area easily occurs.

SUMMARY

Embodiments of the present disclosure provide a light-emitting substrate, a backlight source and a display device.

As a first aspect of the present disclosure, there is provided a light-emitting substrate, including:
- a base substrate having a first surface and a second surface which are opposite, and including a light-emitting area and a bonding area located on a side of the light-emitting area;
- a light-emitting unit disposed on the first surface of the base substrate and located in the light-emitting area, and including a plurality of light-emitting elements which are connected together; and
- transmission lines disposed on the base substrate;
- where at least a part of at least one transmission line is located on the second surface of the base substrate, and two ends of the light-emitting unit are respectively connected to the bonding area through different transmission lines.

In some implementations, the at least one transmission line includes a first transmission part and a second transmission part, the first transmission part is located on the second surface of the base substrate, one end of the first transmission part is connected to the second transmission part, another end of the first transmission part extends to the bonding area, and the second transmission part passes through a first via hole in the base substrate and is connected to the first transmission part and the light-emitting unit.

In some implementations, the light-emitting unit further includes: a connection line, and a signal line located at the two ends of the light-emitting unit, the light-emitting elements in the light-emitting unit are divided into at least one group, each group includes multiple light-emitting elements, which are connected in series between the two ends of the light-emitting unit, every two adjacent light-emitting elements in a same group are connected through the connection line, and a first light-emitting element and a last light-emitting element in the same group are respectively connected to the transmission line through corresponding signal lines;

the light-emitting substrate further includes a first protective layer and a second protective layer, the signal line and the connection line are located between the first protective layer and the base substrate, the first protective layer is provided therein with a second via hole communicating with the first via hole, and the second via hole exposes a part of a surface of the signal line;

the second protective layer is located on a side of the first transmission part away from the base substrate, and is provided therein with a third via hole communicating with the first via hole, and the third via hole exposes a part of a surface of the first transmission part; and the second transmission part passes through the first via hole, the second via hole and the third via hole, and is connected to the signal line and the first transmission part.

In some implementations, a diameter of one end of the second via hole close to the base substrate is smaller than that of another end of the second via hole away from the base substrate.

In some implementations, a diameter of one end of the third via hole close to the base substrate is smaller than that of another end of the third via hole away from the base substrate.

In some implementations, a diameter of the second via hole gradually decreases in a direction approaching the base substrate.

In some implementations, a diameter of the third via hole gradually decreases in a direction approaching the base substrate.

In some implementations, a material of the second transmission part includes silver paste.

In some implementations, each transmission line includes the first transmission part and the second transmission part.

In some implementations, the base substrate is provided with a plurality of side surfaces which are connected between the first surface and the second surface, and at least one transmission line includes a third transmission part, a fourth transmission part, and a fifth transmission part which are connected in sequence;

where the third transmission part is located on the first surface of the base substrate, and two ends of the third transmission part are respectively connected to the light-emitting unit and the fourth transmission part;

the fourth transmission part is located on the side surface of the base substrate; and one end of the fifth transmission part is connected to the fourth transmission part, another end of the fifth transmission part extends to the bonding area, and at least a part of the fifth transmission part is located on the second surface of the base substrate.

In some implementations, the fifth transmission part includes a first transmission sub-part, a second transmission sub-part, and a third transmission sub-part which are connected in sequence; and the first transmission sub-part is connected to the fourth transmission part, the third transmission sub-part is located in the bonding area, and the second transmission sub-part and the fourth transmission part are respectively located on two opposite side surfaces of the base substrate.

In some implementations, materials of the second transmission sub-part and the fourth transmission part each include conductive silver paste.

In some implementations, the light-emitting area is divided into a distal light-emitting area and a proximal light-emitting area, the proximal light-emitting area is located between the distal light-emitting area and the bonding area, the proximal light-emitting area and the distal light-emitting area each are provided with multiple light-emitting units, and each transmission line connected to the light-emitting unit in the distal light-emitting area includes the third transmission part, the fourth transmission part, and the fifth transmission part.

In some implementations, each transmission line connected to the light-emitting unit in the proximal light-emitting area is located on the first surface of the base substrate.

In some implementations, a planarization layer is disposed between the transmission lines and the light-emitting unit, and the two ends of the light-emitting unit are connected to corresponding transmission lines through a fourth via hole in the planarization layer.

In some implementations, the light-emitting unit further includes a connection line and a signal line located at the two ends of the light-emitting unit, the light-emitting elements in the light-emitting unit are divided into at least one group, each group includes multiple light-emitting elements connected in series between the two ends of the light-emitting unit, every two adjacent light-emitting elements in a same group are connected through the connection line, and a first light-emitting element and a last light-emitting element in the same group are respectively connected to the transmission line through corresponding signal lines; each light-emitting element includes a light-emitting part and a pin connected to the light-emitting part;

the light-emitting substrate further includes a first protective layer, the connection line and the signal line are located between the first protective layer and the base substrate, the light-emitting part is located on a side of the first protective layer away from the base substrate, and the pin of the light-emitting element penetrates through the first protective layer and is connected to the connection line or the signal line; and the light-emitting substrate further includes a second protective layer which is located on a side of the first protective layer away from the fifth transmission part.

In some implementations, the light-emitting area includes a plurality of division areas, each division area is provided therein with the light-emitting unit, the light-emitting elements in the light-emitting unit are divided into a plurality of groups, each group includes multiple light-emitting elements connected in series, and different groups of light-emitting elements are connected in parallel.

In some implementations, the light-emitting elements are Micro-LEDs or Mini-LEDs.

As a second aspect of the present disclosure, there is provided a backlight source, including the above light-emitting substrate.

As a third aspect of the present disclosure, there is provided a display device, including the above backlight source.

BRIEF DESCRIPTION OF DRAWINGS

The drawings are used to provide a further understanding of the present disclosure, constitute a part of specification, and explain the present disclosure with the following specific embodiments, but do not constitute a limitation on the present disclosure. In the drawings.

DETAIL DESCRIPTION OF EMBODIMENTS

To make the objectives, technical solutions and advantages of the embodiments of the present disclosure clearer, the technical solutions of the embodiments of the present disclosure are described clearly and completely below with reference to the drawings of the embodiments of the present disclosure. It is apparent that the embodiments described herein are some embodiments of the present disclosure, but not all of the embodiments. All other embodiments, which are obtained by those skilled in the art based on the described embodiments of the present disclosure without inventive work, are within the protection scope of the present disclosure.

Unless otherwise defined, technical terms or scientific terms used herein should have general meanings that can be understood by those of ordinary skill in the art. The words "first" and "second" and the like used in description and claims of the present disclosure do not denote any order, quantity, or importance, but are just used to distinguish between different elements. Similarly, the words "a" or "an" and the like do not denote limitation to quantity, but denote "at least one". The word "include" or "comprise" and the like indicates that an element or object before the word covers elements or objects or the equivalents thereof listed after the word, but do not exclude other elements or objects. The word "connect" and the like is not restricted to physical or mechanical connection, but may include electrical connection, whether direct or indirect. The words "on", "under" and the like are used merely to indicate relative positional relationships, and when an absolute position of an object described is changed, the relative positional relationships may be changed accordingly.

In the following description, when an element or layer is referred to as being "on" or "connected to" another element or layer, the element or layer may be directly on or connected to another element or layer, or intervening elements or layers may be present therebetween. However, when an element or layer is referred to as being "directly on" or "directly connected to" another element or layer, there is no intervening element or layer. The term "and/or" refers to any one or combination of the associated listed items.

Although the terms "first", "second" and the like may be used herein to describe various elements, components, areas, layers and/or parts, these elements, components, areas, layers and/or parts should not be limited by these terms. These terms are used to distinguish one element, component, area, layer and/or part from another element, component, area, layer and/or part. Thus, the elements, components, areas, layers and/or parts defined by "first" below may be defined by "second" without departing from the teachings of the present disclosure.

Figure 1:
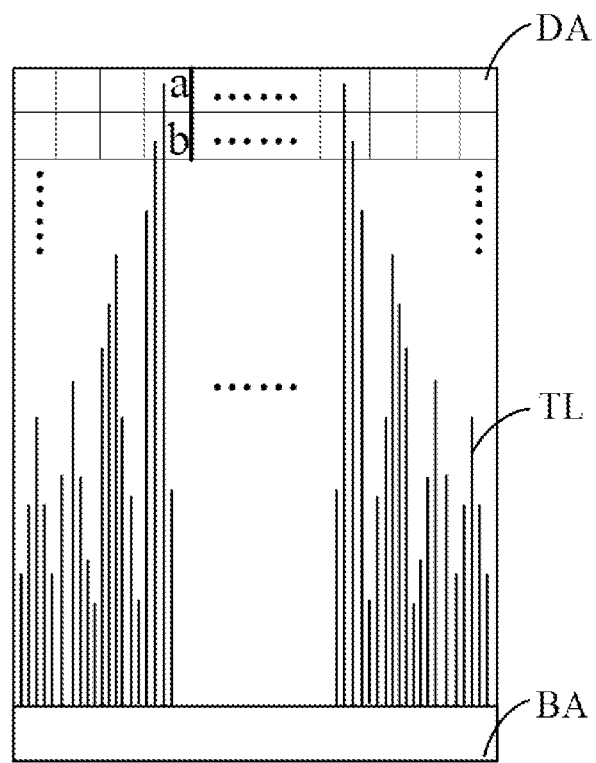
FIG. 1 is a schematic diagram illustrating distribution of transmission lines on a light-emitting substrate.

In a light-emitting module having an array of light-emitting diodes, the light-emitting diodes of the light-emitting module may be controlled according to division areas, and the light-emitting diodes may be Mini LEDs or Micro LEDs (Micro light-emitting diodes). FIG. 1 is a schematic diagram illustrating distribution of transmission lines on a light-emitting substrate. As shown in FIG. 1, the light-emitting substrate includes a plurality of division areas DA, each of which is provided with light-emitting diodes, one end of a transmission line TL extends to a bonding area BA so as to be bonded to a flexible printed circuit board, and another end of the transmission line TL extends to the division area DA, the flexible printed circuit board supplies an electrical signal (e.g., a high-level voltage signal or a low-level voltage signal) of a driving chip to the transmission line TL, so that the electrical signal is transmitted to the light-emitting diodes by the transmission line TL. In addition, the light-emitting diodes in the division area DA may be connected through a connection line, which may result in complicated wiring distribution on the light-emitting substrate, and a relatively large parasitic capacitance may be generated at a position where the transmission line TL overlaps the connection line, thereby affecting control over division areas of the light-emitting diodes. For example, when the light-emitting diodes in the division area DA at a position a are controlled to be turned off and the light-emitting diodes in the division area DA at a position b are controlled to be turned on, since the transmission line TL connected to the light-emitting diodes in the division area DA at the position a also passes through the division area DA at the position b, a parasitic capacitance generated between the transmission line TL and the connection line in the division area DA at the position b may cause the light-emitting diodes in the division area DA at the position b to emit light by mistake. If the parasitic capacitance is to be reduced, a thickness of an insulating layer between the transmission line TL and the connection line needs to be relatively large, resulting in relatively high requirements on material and process.

Figure 2:
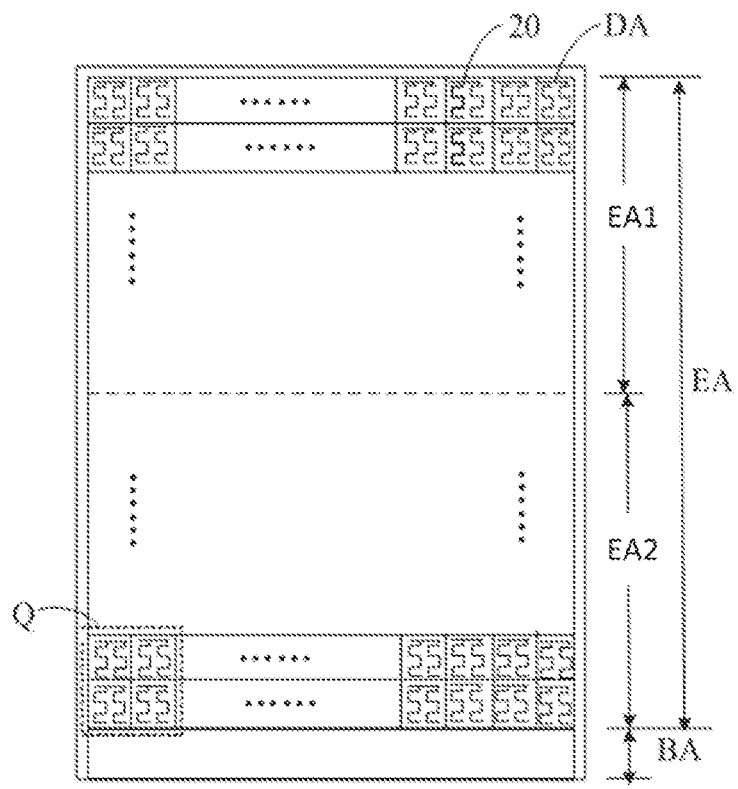
FIG. 2 is a schematic plan view of a light-emitting substrate according to some embodiments of the present disclosure.
Figure 3:
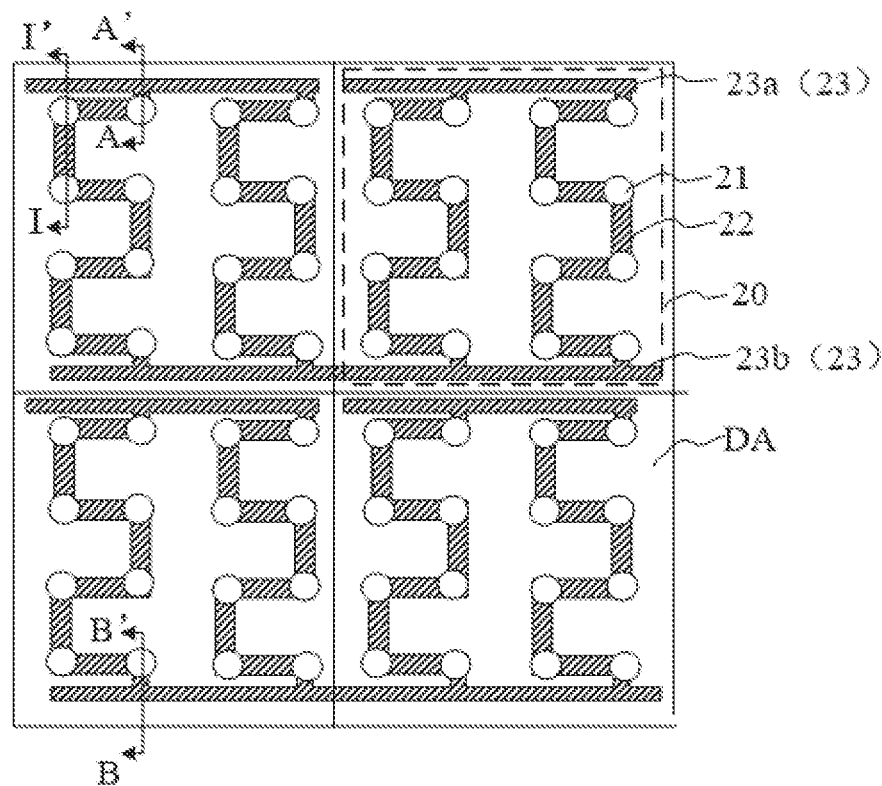
FIG. 3 is an enlarged schematic view of an area Q in FIG. 2.
Figure 4:
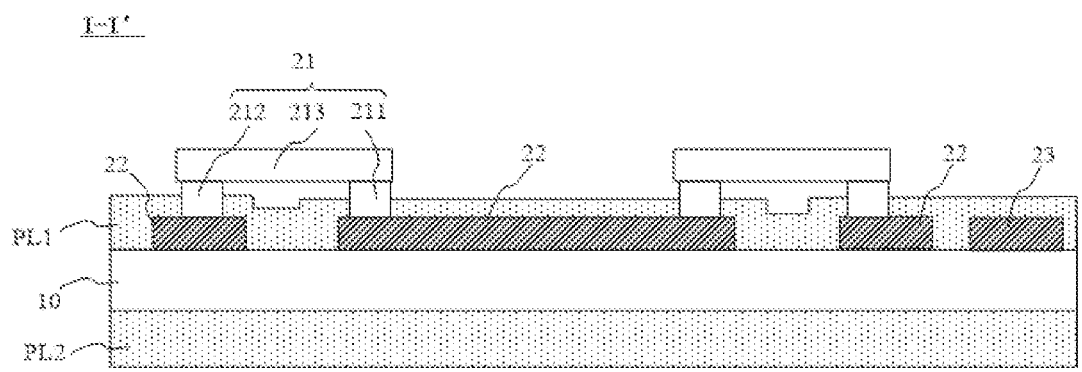
FIG. 4 is a sectional view taken along line I-I' in FIG. 3.
Figure 5:
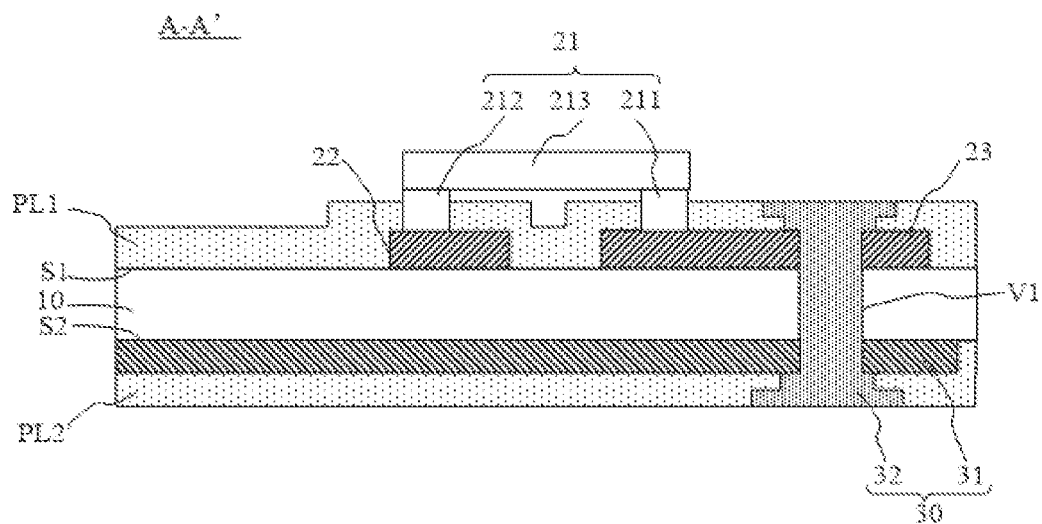
FIG. 5 is a sectional view taken along line A-A' in FIG. 3.

An embodiment of the present disclosure provides a light-emitting substrate. FIG. 2 is a schematic plan view of a light-emitting substrate according to some embodiments of the present disclosure. FIG. 3 is an enlarged schematic view of an area Q in FIG. 2, FIG. 4 is a sectional view taken along line I-I' in FIG. 3, and FIG. 5 is a sectional view taken along line A-A' in FIG. 3. With reference to FIG. 1 to FIG. 5, the light-emitting substrate in the embodiment of the present disclosure includes: a base substrate 10, transmission lines 30, and a light-emitting unit 20, and the transmission lines 30 and the light-emitting unit 20 are disposed on the base substrate 10. The base substrate 10 has a first surface S1 and a second surface S2 which are opposite, and includes a light-emitting area EA and a bonding area BA located on a side of the light-emitting area EA. The light-emitting unit 20 is disposed on the first surface S1 of the base substrate 10 and located in the light-emitting area EA, and the light-emitting unit 20 includes a plurality of light-emitting elements 21 which are connected together. The plurality of light-emitting elements 21 in the light-emitting unit 20 may be connected together in series through a connection line 22; or the plurality of light-emitting elements 21 are divided into a plurality of groups, each of which includes multiple light-emitting elements 21 connected in series, and different groups of light-emitting elements 21 are connected in parallel. Two ends of the light-emitting unit 20 are respectively connected to the bonding area BA through different transmission lines 30. For example, the transmission lines 30 connected to the two ends of the light-emitting unit 20 are used to transmit a high-level signal and a low-level signal, respectively.

At least a part of at least one transmission line 30 is located on the second surface S2 of the base substrate 10. For example, a part of one of the transmission lines 30 is disposed on the second surface S2, or one of the transmission lines 30 is entirely disposed on the second surface S2, or a part of each of the transmission lines 30 is disposed on the second surface S2, or each of the transmission lines 30 is entirely disposed on the second surface S2. The first surface S1 of the base substrate 10 is a surface of the base substrate 10 facing a light exiting direction of the light-emitting elements 21, and the second surface S2 of the base substrate 10 is a surface of the base substrate 10 facing away from the light exiting direction of the light-emitting elements 21. In the embodiment of the present disclosure, "disposed on the first surface S1 (or the second surface S2)" may refers to being directly disposed on the first surface S1 (or the second surface S2), or being indirectly disposed on the first surface S1 (or the second surface S2).

In some implementations, the base substrate 10 is made of glass, or an organic material (e.g., polyimide). In some implementations of the present disclosure, the base substrate 10 is a glass base substrate 10, and may have a thickness ranging from 1 mm to 5 mm.

In the embodiment of the present disclosure, the light-emitting unit 20 is located on the first surface S1 of the base substrate 10, and at least a part of at least one transmission line 30 is located on the second surface S2 of the base substrate 10, so that the transmission line 30 on the second surface S2 and the connection line 22 in the light-emitting unit 20 may be insulated and separated by the base substrate 10. The base substrate 10 usually has a relatively large thickness, so that the parasitic capacitance between the transmission line 30 and the connection line 22 can be reduced, thereby reducing or preventing a phenomenon that light-emitting unit 20 which should be turned off is turned on by mistake. Moreover, no relatively thick insulating layer is required to be added between the light-emitting unit 20 and the transmission line 30, resulting in lower requirements on manufacturing process and material. In addition, a relatively large space exists on a side of the second surface S2 of the base substrate 10, and thus when at least a part of the transmission line 30 is disposed on the second surface S2, a thickness and a width of the transmission line 30 may be increased, thereby reducing a resistance of the transmission line 30 and improving signal transmission efficiency.

In the embodiment of the present disclosure, the light-emitting elements 21 may be Mini-LEDs or Micro-LEDs. As a specific application of the present disclosure, the light-emitting elements 21 are Mini-LEDs. With reference to FIG. 3 to FIG. 5, the light-emitting element 21 includes a light-emitting part 213 and pins 211 and 212 connected to the light-emitting part 213, for example, the pin 211 is an anode pin and the pin 212 is a cathode pin. The light-emitting part 213 is a main body of the light-emitting element 21 for emitting light. The light-emitting unit 20 further includes the connection line 22 and a signal line 23 at the two ends of the light-emitting unit 20. The plurality of light-emitting elements 21 in the light-emitting unit 20 are divided into at least one group, each group includes multiple light-emitting elements 21 connected in series between the two ends of the light-emitting unit 20, every two adjacent light-emitting elements 21 in a same group are connected by the connection line 21, and a first light-emitting element 21 and a last light-emitting element 21 in the same group are connected to the transmission lines 30 through corresponding signal lines 23. For example, the signal line 23 at one end of the light-emitting unit 20 is a high-level signal line 23a, the signal line 23 at the other end of the light-emitting unit 20 is a low-level signal line 23b, the pin 211 of the first light-emitting element 21 in each group is connected to the high-level signal line 23a, the pin 212 of the first light-emitting element 21 is connected to the pin 211 of a second light-emitting element 21 through the connection line 22, the pin 212 of the second light-emitting element 21 is connected to the pin 211 of a third light-emitting element 21 through the connection line 22, and so on, and the pin 212 of the last light-emitting element 21 is connected to the low-level signal line 23b. That is, when the light-emitting elements 21 in the light-emitting unit 20 are divided into a plurality of groups, different groups are connected in parallel through the high-level signal line 23a and the low-level signal line 23b.

In the embodiment of the present disclosure, both the signal line 23 and the connection line 22 may be made of a metal material, which may be a metal such as molybdenum (Mo), aluminum (Al), chromium (Cr), copper (Cu), titanium (Ti), or the like. In addition, both the signal line 23 and the connection line 22 may be a single-layer metal film or a multi-layer metal film. The signal line 23 and the connection line 22 may be disposed in a same layer, and each may have a thickness of about 4.5 μm.

In the embodiment of the present disclosure, the light-emitting area EA may be divided into a distal light-emitting area EA1 and a proximal light-emitting area EA2 located between the distal light-emitting area EA1 and the bonding area BA. The proximal light-emitting area EA2 and the distal light-emitting area EA1 each include multiple division areas DA, for example, the proximal light-emitting area EA2 and the distal light-emitting area EA1 each include division areas DA arranged in rows and columns, and the division areas DA in each column are arranged in a direction gradually approaching the bonding area BA. The number of division areas DA in the proximal light-emitting area EA2 and the number of division areas DA in the distal light-emitting area EA1 may be the same or different. Each division area DA is provided with the light-emitting unit 20 therein, the light-emitting elements 21 in the light-emitting unit 20 may be divided into a plurality of groups, each of which includes multiple light-emitting elements 21 connected in series, and different groups of light-emitting elements 21 are connected in parallel.

High-level signal lines 23a of different division areas DA are independent from each other, while low-level signal lines 23b of different division areas DA may be connected into a single piece, for example, the low-level signal lines 23b of light-emitting units 20 in a same row of division areas DA may be connected into a single piece.

For example, as shown in FIG. 3, the light-emitting unit 20 of each division area DA includes sixteen light-emitting elements 21 which are divided into two groups connected in parallel, and eight light-emitting elements 21 in each group are arranged in two columns and four rows and may be connected in series into a bent structure. The number of the light-emitting elements 21 is the same in the groups, the light-emitting elements 21 in the same row of the division areas DA are uniformly distributed, and an interval between any two adjacent groups may be set according to a size of the division area DA. In a specific example, each division area DA is a rectangular area having a length of about 4 mm and a width of about 4 mm. Certainly, the size of the division area DA may be adjusted according to actual needs. It should be noted that FIG. 3 is only for exemplary illustration, and in practical applications, the light-emitting elements 21 in the light-emitting unit 20 may be divided into groups, each of which includes any other number of light-emitting elements 21.

In some implementations, as shown in FIG. 5, at least one transmission line 30 includes a first transmission part 31 and a second transmission part 32, the first transmission part 31 is located on the second surface S2 of the base substrate 10, one end of the first transmission part 31 is connected to the second transmission part 32, another end of the first transmission part 31 extends to the bonding area BA, and the second transmission part 32 passes through a first via hole V1 in the base substrate 10 and is connected to the first transmission part 31 and the light-emitting unit 20.

The first via hole V1 may be formed by laser drilling. The second transmission part 32 may be made of a conductive medium such as silver paste, which may be dropped in the first via hole V1 by a dropping manner. The first transmission part 31 may be made of a metal material, which may be molybdenum (Mo), aluminum (Al), chromium (Cr), copper (Cu), titanium (Ti), or the like. In addition, the first transmission part 31 may be a single-layer metal film or a multi-layer metal film.

In some implementations, as shown in FIG. 4 and FIG. 5, the light-emitting substrate may further include a first protective layer PL1 and a second protective layer PL2, both the signal line 23 and the connection line 22 are located between the first protective layer PL1 and the base substrate 10, and the second protective layer PL2 is located on a side of the first transmission part 31 away from the base substrate 10. The first protective layer PL1 is configured to protect the signal line 23 and the connection line 22 on the side of the first surface S1 and preventing them from being corroded by external vapor. The second protective layer PL2 is configured to protect the first transmission part 31 on the side of the second surface S2 and prevent it from being corroded by external vapor. The first protective layer PL1 and the second protective layer PL2 may be made of a resin material.

Figure 6:
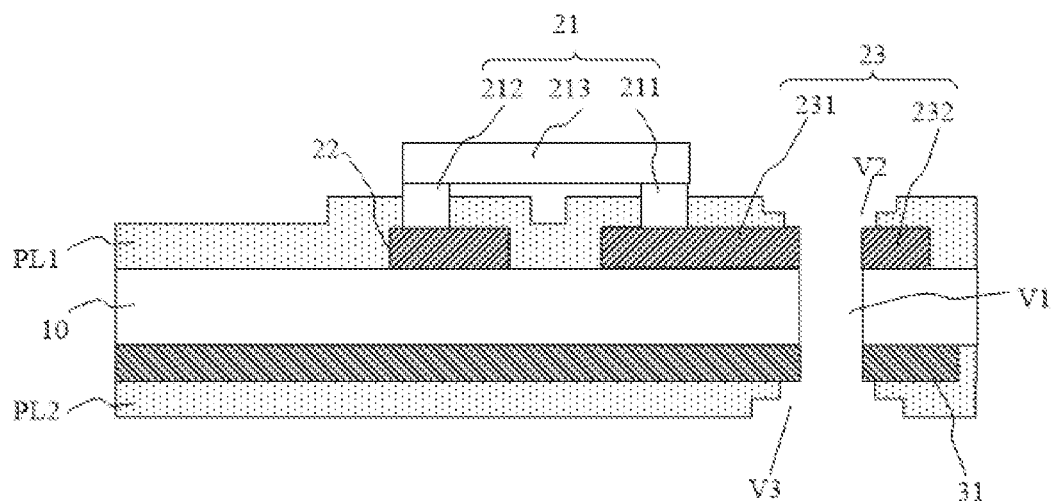
FIG. 6 is a schematic diagram before a second transmission part in FIG. 5 is formed.
Figure 7:
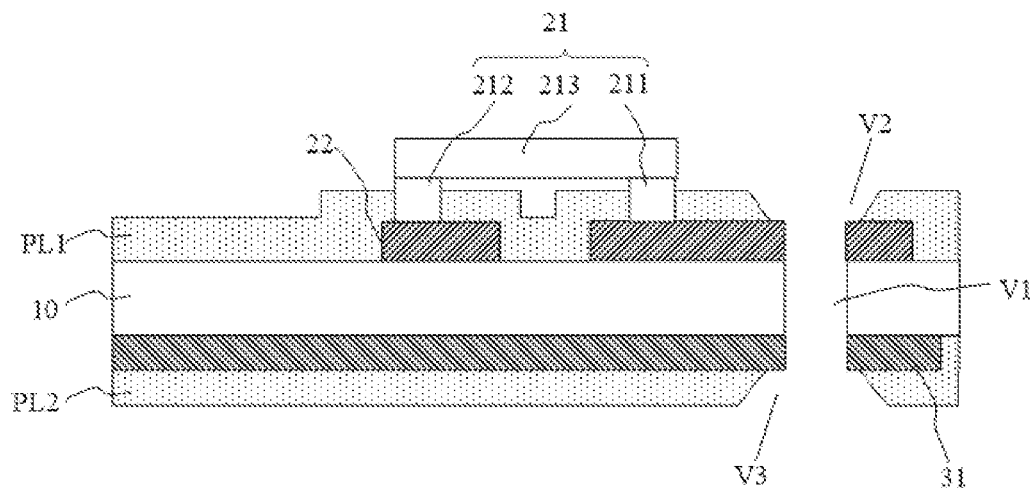
FIG. 7 is another schematic diagram before the second transmission part in FIG. 5 is formed.

FIG. 6 is a schematic diagram before the second transmission part in FIG. 5 is formed, and FIG. 7 is another schematic diagram before the second transmission part in FIG. 5 is formed. With reference to FIG. 5 to FIG. 7, the first protective layer PL1 is provided therein with a second via hole V2 communicating with the first via hole V1, and the second via hole V2 exposes a part of a surface of the signal line 23. The second protective layer PL2 is located on the side of the first transmission part 31 away from the base substrate 10 and is provided therein with a third via hole V3 communicating with the first via hole V1, and the third via hole V3 exposes a part of a surface of the first transmission part 31. The second transmission part 32 passes through the first via hole V1, the second via hole V2, and the third via hole V3, and is connected to the signal line 23 and the first transmission part 31.

As shown in FIG. 6, the signal line 23 connected to the second transmission part 32 is divided into two conductive parts 231 and 232 at the second via hole V2, and a gap between the two conductive parts 231 and 232 may be smaller than a diameter of one end of the second via hole V2 close to the base substrate 10, so that the second transmission part 32 may be in contact with surfaces of the conductive parts 231 and 232 away from the base substrate 10, and side surfaces of the conductive parts 231 and 232. Alternatively, the gap between the conductive parts 231 and 232 is equal to the diameter of the end of the second via hole V2 close to the base substrate 10, and in such case, the second transmission part 32 may be in contact with the side surfaces of the conductive parts 231 and 232.

In some implementations, as shown in FIG. 6 and FIG. 7, the diameter of the end of the second via hole V2 close to the base substrate 10 is smaller than that of another end of the second via hole V2 away from the base substrate 10, so that the second transmission part 32 and the signal line 23 are connected more securely. Moreover, a problem that an uneven film may be caused by the conductive medium overflowing onto the first protective layer PL1 when the second transmission part 32 is manufactured can be reduced or prevented. For example, as shown in FIG. 7, the diameter of the second via hole V2 gradually decreases in a direction approaching the base substrate 10. Alternatively, as shown in FIG. 6, the diameter of the second via hole V2 decreases stepwise in the direction approaching the base substrate 10. For example, the second via hole V2 includes two sub-via holes which are arranged coaxially, and a diameter of one sub-via hole away from the base substrate 10 is greater than that of the other sub-via hole close to the base substrate 10.

In some implementations, a diameter of one end of the third via hole V3 close to the base substrate 10 is smaller than that of another end of the third via hole V3 away from the base substrate 10, so that the second transmission part 32 and the first transmission part 31 are connected more securely. Moreover, a problem that an uneven film may be caused by the conductive medium overflowing onto the second protective layer PL2 when the second transmission part 32 is manufactured can be reduced or prevented. For example, as shown in FIG. 7, the diameter of the third via hole V3 gradually decreases in a direction approaching the base substrate 10. Alternatively, as shown in FIG. 6, the diameter of the third via hole V3 decreases stepwise in the direction approaching the base substrate 10. For example, the third via hole V3 includes two sub-via holes which are arranged coaxially, and a diameter of one sub-via hole away from the base substrate 10 is greater than that of the other sub-via hole close to the base substrate 10.

In some implementations, in order to connect the second transmission part 32 to the first transmission part 31 and the signal line 23 reliably, the diameter of the end of the second via hole V2 close to the base substrate 10 may be smaller than that of the end of the second via hole V2 away from the base substrate 10, and meanwhile, the diameter of the end of the third via hole V3 close to the base substrate 10 may be smaller than that of the end of the third via hole V3 away from the base substrate 10.

Exemplarily, the first via hole V1, the second via hole V2, and the third via hole V3 each have a diameter ranging from 50 μm to 300 μm. In the embodiment of the present disclosure, shapes of the first via hole V1, the second via hole V2, and the third via hole V3 are not particularly limited, for example, the first via hole V1, the second via hole V2, and the third via hole V3 each may have a circular cross section, or a rectangular cross section.

Figure 8:
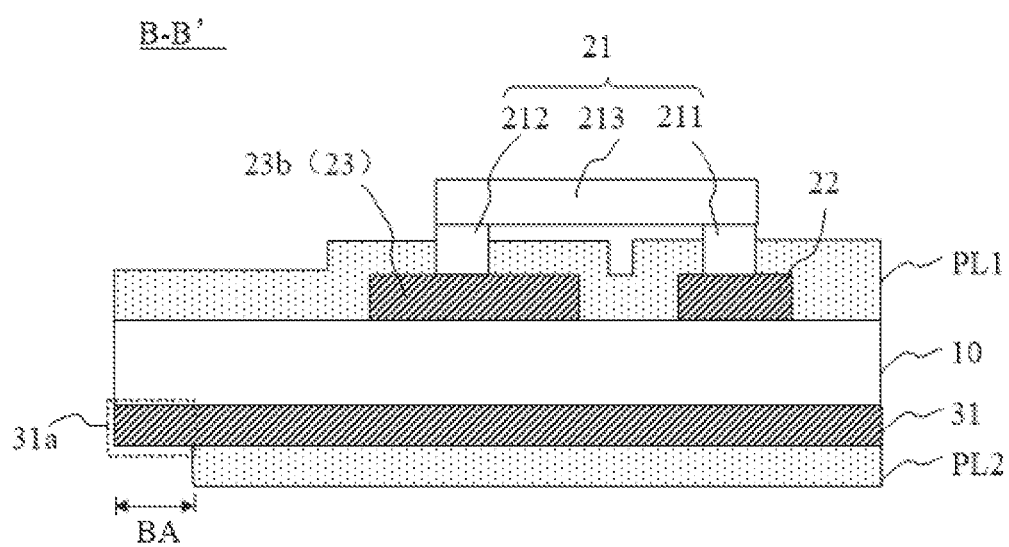
FIG. 8 is a sectional view taken along line B-B' in FIG. 3.

FIG. 8 is a sectional view taken along line B-B' in FIG. 3. As shown in FIG. 8, the second protective layer PL2 further exposes a part 31a of the first transmission part 31 located in the bonding area BA, so that the part 31a of the first transmission part 31 located in the bonding area BA is bonded to the flexible printed circuit board.

In some implementations, each transmission line 30 may be arranged into a structure including the first transmission part 31 and the second transmission part 32, and in such case, a bonding chip is bonded to each transmission line 30 on the side of the second surface S2 of the base substrate 10. In this case, the first transmission part 31 and the light-emitting unit 20 are insulated and separated by the base substrate 10, and thus no additional insulating layer is required to be arranged between the first transmission part 31 and the light-emitting unit 20.

Figure 9:
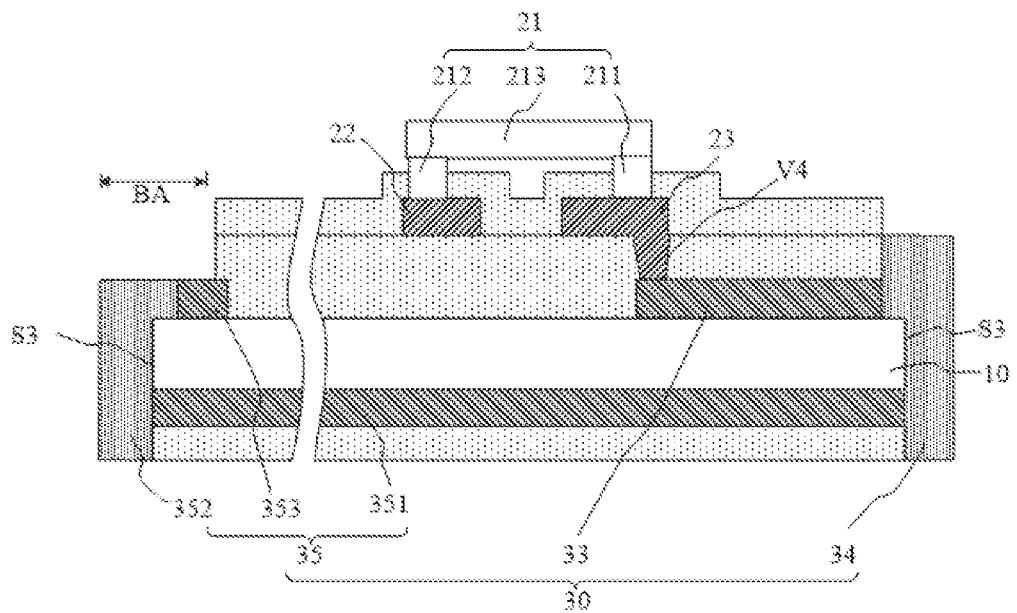
FIG. 9 is a schematic diagram illustrating a connection mode of a transmission line and a signal line according to some embodiments of the present disclosure.
Figure 10:
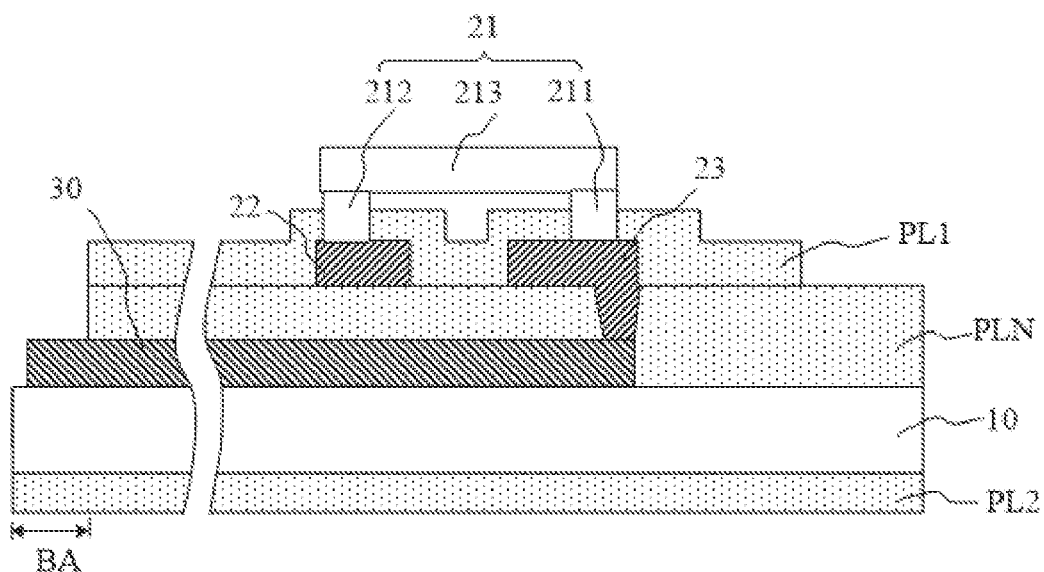
FIG. 10 is a schematic diagram illustrating another connection mode of a transmission line and a signal line according to some embodiments of the present disclosure.

FIG. 9 is a schematic diagram illustrating a connection mode of a transmission line and a signal line according to some embodiments of the present disclosure, and FIG. 10 is a schematic diagram illustrating another connection mode of a transmission line and a signal line according to some embodiments of the present disclosure. As shown in FIG. 9 and FIG. 10, the base substrate 10 has a plurality of side surfaces S3 connected between the first surface S1 and the second surface S2, and at least one transmission line 30 includes a third transmission part 33, a fourth transmission part 34, and a fifth transmission part 35 which are connected in sequence. The third transmission part 33 is located on the first surface S1 of the base substrate 10, and one end of the third transmission part 33 is connected to the light-emitting unit 20 and another end of the third transmission part 33 is connected to the fourth transmission part 34. Specifically, the third transmission part 33 being connected to the light-emitting unit 20 is that the third transmission part 33 is connected to the signal line 23 of the light-emitting unit 20. One end of the fourth transmission part 34 is connected to the third transmission part 33, another end of the fourth transmission part 34 is connected to the fifth transmission part 35, and the fourth transmission part 34 is located on the side surface S3 of the base substrate 10. One end of the fifth transmission part 35 is connected to the fourth transmission part 34, and another end of the fifth transmission part 35 extends to the bonding area BA, so as to be bonded to the flexible printed circuit board. At least a part of the fifth transmission part 35 is located on the second surface S2.

Further, the fifth transmission part 35 includes a first transmission sub-part 351, a second transmission sub-part 352, and a third transmission sub-part 353 which are connected in sequence. The first transmission sub-part 351 is connected to the fourth transmission part 34. The third transmission sub-part 353 is located in the bonding area BA and is configured to be bonded to the flexible printed circuit board. The second transmission sub-part 352 and the fourth transmission part 34 are located on two opposite side surfaces S3 of the base substrate 10, respectively. For example, the second transmission sub-part 352 is located on the side surface S3 close to the bonding area BA and substantially parallel to a direction in which the bonding area BA extends, and the third transmission part 33 is located on the side surface S3 away from the bonding area BA and substantially parallel to the direction in which the bonding area BA extends. The direction in which the bonding area BA extends is perpendicular to a direction along which the light-emitting area EA and the bonding area BA are arranged.

For example, manufacturing materials of the second transmission sub-part 352 and the fourth transmission part 34 each include conductive silver paste.

In some embodiments of the present disclosure, the transmission line 30 connected to the light-emitting unit 20 in the distal light-emitting area EA1 may adopt a structure having the third transmission part 33, the fourth transmission part 34 and the fifth transmission part 35. In some specific examples, the number of the division areas DA in the distal light-emitting area EA1 is greater than or equal to that of the division areas DA in the proximal light-emitting area EA2, and in such case, at least half of the transmission lines 30 in the light-emitting substrate each include the third transmission part 33, the fourth transmission part 34, and the fifth transmission part 35.

The transmission line 30 connected to the proximal light-emitting area EA2 may be located on the first surface S1 of the base substrate 10 (as shown in FIG. 10). For example, the transmission line 30 connected to the proximal light-emitting area EA2 is disposed in the same layer as the third transmission parts 33. Certainly, the transmission line 30 connected to the proximal light-emitting area EA2 may also adopt the structure having the third transmission part 33, the fourth transmission part 34 and the fifth transmission part 35.

As shown in FIG. 9 and FIG. 10, a planarization layer PLN is disposed between the transmission line 30 and the light-emitting unit 20, and exposes a part of the transmission line 30 located in the bonding area BA, so that the transmission line 30 is bonded to the driving chip. The two ends of the light-emitting unit 20 are connected to corresponding transmission lines 30 through a fourth via hole V4 in the planarization layer PLN.

For example, the planarization layer PLN may be made of an organic material such as resin, and a surface of the planarization layer PLN away from the base substrate 10 is substantially flat.

As shown in FIG. 9 and FIG. 10, the light-emitting substrate further includes a first protective layer PL1 and a second protective layer PL2. The connection line 22 and the signal line 23 are located between the first protective layer PL1 and the base substrate 10, and are located between the first protective layer PL1 and the planarization layer PLN, the light-emitting part 213 of the light-emitting element 21 is located on a side of the first protective layer PL1 away from the base substrate 10, and the pins 211 and 212 of the light-emitting element 21 penetrate through the first protective layer PL1 and are connected to the connection line 22 or the signal line 23. The second protective layer PL2 is located on a side of the fifth transmission part 35 away from the first protective layer PL1. The first protective layer PL1 protects the connection line 22 and the signal line 23, and the second protective layer PL2 protects the part of the transmission line 30 located on the second surface S2.

In above embodiments of the present disclosure, each transmission line 30 may be arranged as that mode shown in FIG. 5, or a portion of the transmission lines 30 may be arranged as that mode shown in FIG. 9, and another portion of the transmission lines 30 may be arranged as that mode shown in FIG. 10. However, the embodiments of the present disclosure are not limited thereto. For example, a portion of the transmission lines 30 may be arranged as that mode shown in FIG. 5 so that each transmission line 30 includes the first transmission part 31 and the second transmission part 32; while another portion of the transmission lines 30 may be arranged as that mode shown in FIG. 9 so that each transmission line 30 includes the third transmission part 33, the fourth transmission part 34 and the fifth transmission part 35. In this way, the flexible printed circuit board needs to be bonded to a portion of the transmission lines 30 from the side of the second surface S2 of the base substrate 10 and to be bonded to another portion of the transmission lines 30 from the side of the first surface S1 of the base substrate 10.

In the embodiment of the present disclosure, a reflective layer may be further disposed on the side of the first protective layer PL1 away from the base substrate 10, and is provided therein with through holes which are in correspondence with the light-emitting elements 21 one to one. The light-emitting elements 21 are exposed from corresponding through holes, and the reflective layer may reflect light from the light-emitting elements 21, so as to improve light utilization rate. In addition, in the embodiment of the present disclosure, the bonding area BA may be provided therein with Indium Tin Oxide (ITO) films which are in correspondence with the transmission lines 30 one to one, and a part of each transmission line 30 located in the bonding area BA is covered by the ITO film so as to prevent the metallic transmission line 30 from being corroded by external vapor. An alignment mark may be further disposed on the base substrate 10, and a position of a mask may be adjusted with reference to the alignment mark when each layer structure is formed by a patterning process.

It should be understood that the light-emitting substrate in the embodiments of the present disclosure may be used as a backlight source lamp panel, and all of the light-emitting units in the light-emitting substrate can emit light with a same color such as blue, and can supply backlight to a passive display panel (e.g., a liquid crystal display panel) by cooperating with a light conversion layer, or each light-emitting unit in the light-emitting substrate in the embodiments of the present disclosure may be used as a pixel, the light-emitting substrate includes a red light-emitting unit, a blue light-emitting unit and a green light-emitting unit, and the light-emitting units with different colors cooperate with each other, so that color display can be achieved.

An embodiment of the present disclosure further provides a backlight source, including the light-emitting substrate according to any one of the above embodiments.

The backlight source may further include a driving chip and a flexible printed circuit board which are electrically connected, and the flexible printed circuit board is bonded to a part of the transmission line in the light-emitting substrate, which is located in the bonding area BA, so as to supply the electrical signal supplied by the driving chip to the light-emitting elements 21.

In the embodiment of the present disclosure, at least a part of at least one transmission line 30 is located on the second surface S2 of the base substrate 10, so that the parasitic capacitance between the transmission line 30 and the connection line 22 in the light-emitting unit 20 can be reduced, and thus, when the light-emitting elements 21 are controlled according to the division areas, a phenomenon that the light-emitting elements 21 which should be turned off are turned on by mistake is prevented.

An embodiment of the present disclosure further provides a display device, including the backlight source in the above embodiment.

The display device may further include a liquid crystal display panel located on a light exiting side of the backlight source, so that the backlight source may be used as the backlight source of the liquid crystal display panel to supply backlight to the liquid crystal display panel. The display device may be any product or component with a display function, such as a liquid crystal display, a mobile phone, a tablet computer, a television, a laptop, a digital photo frame, a navigator and the like.

In the embodiment of the present disclosure, at least a part of at least one transmission line 30 is located on the second surface S2 of the base substrate 10, so that the parasitic capacitance between the transmission line 30 and the connection line 22 in the light-emitting unit 20 can be reduced, and thus, when the light-emitting elements 21 are controlled according to the division areas, a phenomenon that the light-emitting elements 21 which should be turned off are turned on by mistake is prevented, thereby improving a display effect of the display device.

It should be understood that the above embodiments are merely exemplary embodiments that are employed to illustrate the principles of the present disclosure, and that the present disclosure is not limited thereto. Various changes and modifications may be made by those skilled in the art without departing from the spirit and essence of the present disclosure, and should be considered to fall within the protection scope of the present disclosure.

What is claimed is:

1. A light-emitting substrate, comprising:
a base substrate having a first surface and a second surface which are opposite, and comprising a light-emitting area and a bonding area located on a side of the light-emitting area;
a light-emitting unit disposed on the first surface of the base substrate and located in the light-emitting area, and comprising a plurality of light-emitting elements which are connected together; and
transmission lines disposed on the base substrate; wherein
at least a part of at least one transmission line is located on the second surface of the base substrate; and
two ends of the light-emitting unit are respectively connected to the bonding area through different transmission lines,
wherein the base substrate has a plurality of side surfaces which are connected between the first surface and the second surface, and at least one transmission line comprises a third transmission part, a fourth transmission part, and a fifth transmission part which are connected in sequence;
the third transmission part is located on the first surface of the base substrate, and two ends of the third transmission part are respectively connected to the light-emitting unit and the fourth transmission part;
the fourth transmission part is located on the side surface of the base substrate; and
one end of the fifth transmission part is connected to the fourth transmission part, another end of the fifth transmission part extends to the bonding area, and at least a part of the fifth transmission part is located on the second surface of the base substrate.

2. The light-emitting substrate of claim 1, wherein at least one transmission line comprises a first transmission part and a second transmission part, the first transmission part is located on the second surface of the base substrate, one end of the first transmission part is connected to the second transmission part, another end of the first transmission part extends to the bonding area, and the second transmission part passes through a first via hole in the base substrate and is connected to the first transmission part and the light-emitting unit.

3. The light-emitting substrate of claim 2, wherein the light-emitting unit further comprises: a connection line, and a signal line located at the two ends of the light-emitting unit, the light-emitting elements in the light-emitting unit are divided into at least one group, each group comprises multiple light-emitting elements connected in series between the two ends of the light-emitting unit, every two adjacent light-emitting elements in a same group are connected through the connection line, and a first light-emitting element and a last light-emitting element in the same group are respectively connected to the transmission line through corresponding signal lines;
the light-emitting substrate further comprises a first protective layer and a second protective layer, the signal line and the connection line are located between the first protective layer and the base substrate, the first protective layer is provided with a second via hole communicating with the first via hole, and the second via hole exposes a part of a surface of the signal line;
the second protective layer is located on a side of the first transmission part away from the base substrate, and is provided with a third via hole communicating with the first via hole, and the third via hole exposes a part of a surface of the first transmission part; and
the second transmission part passes through the first via hole, the second via hole and the third via hole, and is connected to the signal line and the first transmission part.

4. The light-emitting substrate of claim 3, wherein a diameter of one end of the second via hole close to the base substrate is smaller than that of another end of the second via hole away from the base substrate.

5. The light-emitting substrate of claim 3, wherein a diameter of one end of the third via hole close to the base substrate is smaller than that of another end of the third via hole away from the base substrate.

6. The light-emitting substrate of claim 3, wherein a diameter of the second via hole gradually decreases in a direction approaching the base substrate.

7. The light-emitting substrate of claim 3, wherein a diameter of the third via hole gradually decreases in a direction approaching the base substrate.

8. The light-emitting substrate of claim 2, wherein a material of the second transmission part comprises silver paste.

9. The light-emitting substrate of claim 2, wherein each transmission line comprises the first transmission part and the second transmission part.

10. The light-emitting substrate of claim 1, wherein the fifth transmission part comprises a first transmission sub-part, a second transmission sub-part, and a third transmission sub-part which are connected in sequence; and
the first transmission sub-part is connected to the fourth transmission part, the third transmission sub-part is located in the bonding area, and the second transmission sub-part and the fourth transmission part are respectively located on two opposite side surfaces of the base substrate.

11. The light-emitting substrate of claim 10, wherein manufacturing materials of the second transmission sub-part and the fourth transmission part each comprise conductive silver paste.

12. The light-emitting substrate of claim 1, wherein the light-emitting area is divided into a distal light-emitting area and a proximal light-emitting area, the proximal light-emitting area is located between the distal light-emitting area and the bonding area, the proximal light-emitting area and the distal light-emitting area each are provided with multiple light-emitting units therein, and each transmission line connected to the light-emitting unit in the distal light-emitting area comprises the third transmission part, the fourth transmission part, and the fifth transmission part.

13. The light-emitting substrate of claim 12, wherein each transmission line connected to the light-emitting unit in the proximal light-emitting area is located on the first surface of the base substrate.

14. The light-emitting substrate of claim 1, wherein a planarization layer is disposed between the transmission line and the light-emitting unit, and the two ends of the light-emitting unit are connected to corresponding transmission lines through a fourth via hole in the planarization layer.

15. The light-emitting substrate of claim 1, wherein the light-emitting unit further comprises a connection line and a signal line located at the two ends of the light-emitting unit, the light-emitting elements in the light-emitting unit are divided into at least one group, each group comprises multiple light-emitting elements connected in series between the two ends of the light-emitting unit, every two adjacent light-emitting elements in a same group are connected through the connection line, and a first light-emitting element and a last light-emitting element in the same group are respectively connected to the transmission line through corresponding signal lines; the light-emitting element comprises a light-emitting part and a pin connected to the light-emitting part;
- the light-emitting substrate further comprises a first protective layer, the connection line and the signal line are located between the first protective layer and the base substrate, the light-emitting part is located on a side of the first protective layer away from the base substrate, and the pin of the light-emitting element penetrates through the first protective layer and is connected to the connection line or the signal line; and
- the light-emitting substrate further comprises a second protective layer which is located on a side of the first protective layer away from the fifth transmission part.

16. The light-emitting substrate of claim 1, wherein the light-emitting area comprises a plurality of division areas, each division area is provided with the light-emitting unit, the light-emitting elements in the light-emitting unit are divided into a plurality of groups, each group comprises multiple light-emitting elements connected in series, and different groups of light-emitting elements are connected in parallel.

17. The light-emitting substrate of claim 1, wherein the light-emitting elements are Micro-LEDs or Mini-LEDs.

18. A backlight source, comprising the light-emitting substrate of claim 1.

19. A display device, comprising the backlight source of claim 18.

20. A light-emitting substrate, comprising:
a base substrate having a first surface and a second surface which are opposite, and comprising a light-emitting area and a bonding area located on a side of the light-emitting area;

a light-emitting unit disposed on the first surface of the base substrate and located in the light-emitting area, and comprising a plurality of light-emitting elements which are connected together; and transmission lines disposed on the base substrate; wherein at least a part of at least one transmission line is located on the second surface of the base substrate; and two ends of the light-emitting unit are respectively connected to the bonding area through different transmission lines, wherein at least one transmission line comprises a first transmission part and a second transmission part, the first transmission part is located on the second surface of the base substrate, one end of the first transmission part is connected to the second transmission part, another end of the first transmission part extends to the bonding area, and the second transmission part passes through a first via hole in the base substrate and is connected to the first transmission part and the light-emitting unit, wherein the light-emitting unit further comprises: a connection line, and a signal line located at the two ends of the light-emitting unit, the light-emitting elements in the light-emitting unit are divided into at least one group, each group comprises multiple light-emitting elements connected in series between the two ends of the light-emitting unit, every two adjacent light-emitting elements in a same group are connected through the connection line, and a first light-emitting element and a last light-emitting element in the same group are respectively connected to the transmission line through corresponding signal lines;

the light-emitting substrate further comprises a first protective layer and a second protective layer, the signal line and the connection line are located between the first protective layer and the base substrate, the first protective layer is provided with a second via hole communicating with the first via hole, and the second via hole exposes a part of a surface of the signal line;

the second protective layer is located on a side of the first transmission part away from the base substrate, and is provided with a third via hole communicating with the first via hole, and the third via hole exposes a part of a surface of the first transmission part; and the second transmission part passes through the first via hole, the second via hole and the third via hole, and is connected to the signal line and the first transmission part.

* * * * *